United States Patent [19]

Custode

[11] 4,229,755
[45] Oct. 21, 1980

[54] FABRICATION OF VERY LARGE SCALE INTEGRATED CIRCUITS CONTAINING N-CHANNEL SILICON GATE NONVOLATILE MEMORY ELEMENTS

[75] Inventor: Frank Z. Custode, Norco, Calif.

[73] Assignee: Rockwell International Corporation, El Segundo, Calif.

[21] Appl. No.: 934,223

[22] Filed: Aug. 15, 1978

[51] Int. Cl.³ .............................................. H01L 27/02
[52] U.S. Cl. ...................................... 357/41; 29/571; 29/578; 29/577 R
[58] Field of Search ......................... 29/571, 577, 578; 357/41

[56] References Cited

U.S. PATENT DOCUMENTS

| | | | |
|---|---|---|---|
| 3,475,234 | 10/1969 | Kerwin | 29/571 |
| 3,728,784 | 4/1973 | Schmidt | 29/578 |
| 4,085,498 | 4/1978 | Rideout | 29/571 |
| 4,161,417 | 7/1979 | Yim | 29/571 |

Primary Examiner—W. C. Tupman
Attorney, Agent, or Firm—H. Fredrick Hamann; Harry John Staas

[57] ABSTRACT

A method of fabricating very large scale integrated circuits including N-channel silicon gate nonvolatile memory elements and additional peripheral transistor elements. The nonvolatile memory elements are fabricated as PDS protected drain-source devices composed of a variable threshold memory device having a thin silicon dioxide gate insulator in combination with a pair of fixed threshold devices having a thicker silicon dioxide gate insulator arranged with a common silicon nitride layer and common gate electrode. The additional fixed threshold peripheral transistors are fabricated without a silicon nitride layer. In addition, the method contains no processing steps subsequent to the fabrication of the PDS devices which necessitate the application of temperatures in excess of 900° C.

10 Claims, 22 Drawing Figures

FABRICATION OF VERY LARGE SCALE INTEGRATED CIRCUITS CONTAINING N-CHANNEL SILICON GATE NONVOLATILE MEMORY ELEMENTS

BACKGROUND OF THE INVENTION

1. Field of the Invention

The invention relates to the fabrication of a very large scale integrated circuit including both protected drain-source variable threshold N-channel silicon gate nonvolatile memory elements and fixed threshold devices.

2. Description of the Prior Art

During recent years extensive progress has been made in the development of EAROM technology. However, all of the existing prior art devices use aluminum gate P-channel technology, which limits the read access time of the memory to one microsecond and the bit density to between 4 and 8 kilobits per chip. To meet the performance requirements for many systems, a read access time of less than 3 hundred nanoseconds must be achieved; in addition, bit densities must be improved by at least a factor of 4 (i.e. 16 kilobits—32 kilobits per chip).

Figure 21A:
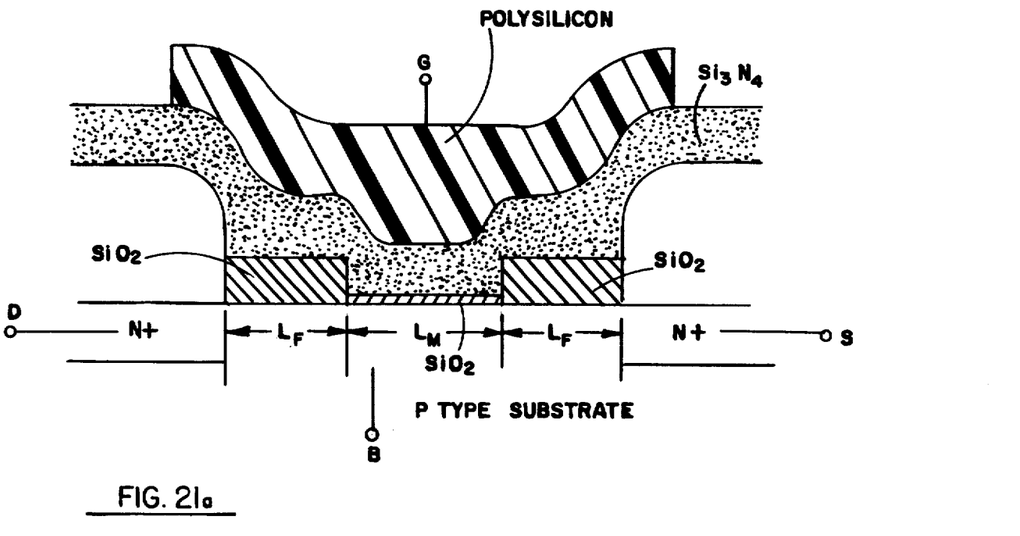
FIGS. 21a and 21b illustrate respectively a cross-sectional view of a PDS memory element and its equivalent electrical circuit.
Figure 21B:
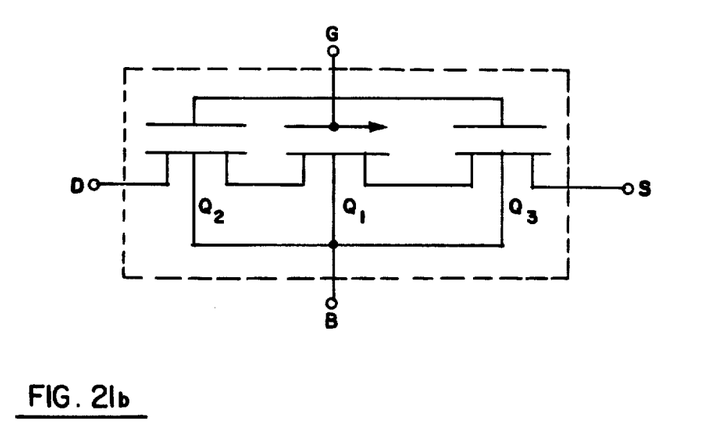

In prior art MNOS memory devices, the variable threshold transistor contains a thin gate oxice layer composed of silicon dioxide (typically 25 Å thick) covered by a silicon nitride layer (typically 350 Å thick) and then by an aluminum or polysilicon electrode. The article entitled "Threshold-Alterable Si-Gate MOS Devices," authored by Peter C. Y. Chen and published in Vol. ED-24, No. 5, May 1977 of the IEEE Transactions on Electron Devices (pp. 584–586), discusses such memory devices. The thin silicon dioxide gate insulator layer is necessary to achieve the memory function with nonvolatile storage in the silicon nitride layer. A problem, however, arises in that the thin silicon dioxide/silicon nitride layer results in a very low breakdown voltage $BV_{DSS}$ (e.g., less than 20 volts). Unfortunately, the device requires a minimum of 25 volts to effectively write or erase the charge stored in the silicon nitride layer. The prior art solution to the problem was the fabrication of a protected drain-source device (PDS). As illustrated in FIG. 21a and FIG. 21b, a PDS device is equivalent to a variable threshold device having a thin silicon dioxide layer surrounded by a pair of peripheral transistors $Q_2$ and $Q_3$ having much thicker silicon dioxide gate insulator layers. By this means, a memory device may be fabricated having a $BV_{DSS}$ on the order of 30 volts. U.S. Pat. No. 3,719,866 discloses and claims such a device having a P-type channel region.

Unfortunately, the PDS device fabrication techniques of the prior art present certain severe drawbacks. Because of the fabrication techniques used, all of the transistors contained within an LSI chip having PDS devices are fabricated with a silicon dioxide/silicon nitride dual gate insulator layer. While this dual insulator layer suffices for the variable threshold memory element, it unfortunately causes a change in the threshold of the device. This change of threshold actually varies with time, causing a fixed threshold device containing such a dual layer insulator to be unstable.

Another problem in the fabrication of prior art devices is that, subsequently to the fabrication of PDS memory devices, additional processing steps are required which necessitate elevated processing temperatures, e.g., above 900° C. These additional, high temperature processing steps cause degradation in the charge retention capability of the silicon nitride layer of the PDS device (e.g., the PDS device may store a charge for only a few months, rather than a few years as intended).

SUMMARY OF THE INVENTION

The invention comprises a technique for fabricating a very large scale integrated circuit chip including fixed threshold devices having gate insulators composed of only a single silicon dioxide layer, and PDS protected drain-source memory devices having dual layer gate insulators composed of silicon dioxide and silicon nitride. The memory transistor portion of the PDS devices are fabricated with silicon dioxide gate insulator layers having a thickness on the order of 25 Å while the remaining portion of the PDS structure has gate insulator layers comprising silicon dioxide having a thickness on the order of 700 Å and silicon nitride having a thickness on the order of 350 Å. An integrated circuit fabricated in accordance with the present invention may contain both depletion and enhancement mode insulated gate devices.

The fabrication technique in accordance with the present invention comprises no processing steps subsequent to the formation of the PDS memory devices necessitating a temperature above 900° C. This avoids any degradation in the silicon nitride layer of the PDS memory devices.

BRIEF DESCRIPTION OF THE DRAWINGS

FIG. 8 is a top view of the semiconductor wafer illustrated in cross-section in FIG. 7.

DESCRIPTION OF THE PREFERRED EMBODIMENT

Figure 1:
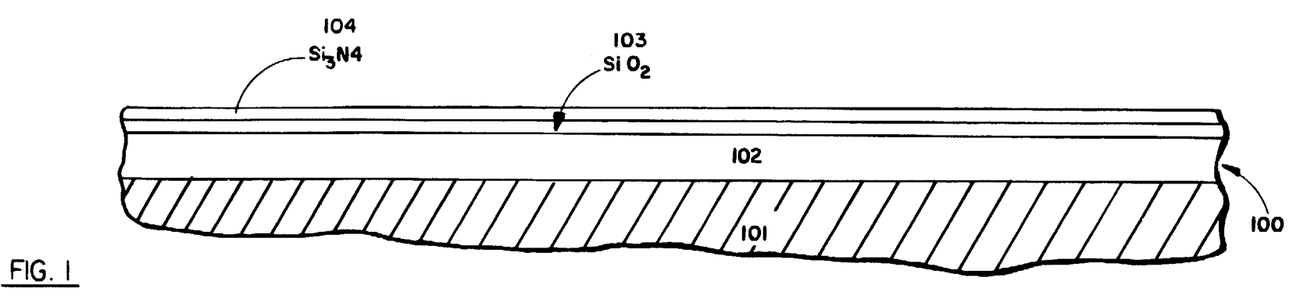
FIGS. 1–4, 6, 7, and 8–20 are cross-sectional views of a semiconductor wafer processed in accordance with the preferred embodiment of the present invention.

FIG. 1 illustrates a silicon wafer 100 after having undergone some of the preliminary processing steps in accordance with the present invention. The wafer 100 is formed by starting with an N type bulk silicon (100) material 101.

A P type (100) epitaxial silicon layer 102 is then grown on the N type bulk silicon material 101. Typically, the epitaxial layer 102 has a resistivity in the range of between 1 and 3 ohm CM and is grown to a thickness in the range of 10 to 13 microns.

The wafer 100 is then subjected to a thermal oxidation process so as to grow a silicon dioxide layer 103 atop the epitaxial layer 102. Typically, a silicon dioxide layer on the order of 600 Å is grown.

A silicon nitride layer 104 is then deposited on top of the silicon dioxide layer 103. This nitride layer may typically be of a thickness on the order of 575 Å.

A layer of undoped Silox having a thickness on the order of 3000 A may optionaly be deposited on the silicon nitride layer 104 and then thermally densified. The purpose of this optimal Silox layer is to protect the silicon nitride layer 104 from possible deterioration during the subsequent phosphorus deposition process.

The need for this optimal Silox layer is dependent upon the quality of the silicon nitride layer 104. If a high quality silicon nitride material is deposited, the subsequent phosphorus deposition process will not cause deterioration of the silicon nitride layer 104 to a point where it is not longer usable. For purposes of clarity, this optimal Silox layer is not illustrated in the drawing figures.

A photoresist layer 105 is then applied to the surface of the nitride layer 104. This photoresist layer 105 is of a material whose solubility in a predetermined "developer" solvent changes when exposed actinic radiation. As one skilled in the art would be aware of, there are numerous commercially available photoresist materials haing such characteristics. By exposing the photoresist layer 105 to actinic radiation through a mask containing areas which are opaque to the actinic radiation as well as areas which are transparent to the actinic radiation, and by developing the thus exposed photoresist layer 105 by placing the wafer 100 in a bath of the predetermined "developer" solvent, one can selectively remove predetermined portions of the photoresist layer 105.

Figure 2:
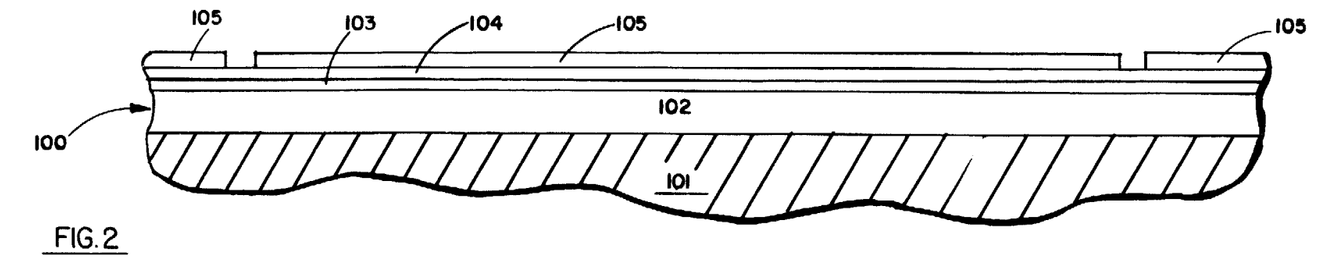

FIG. 2 illustrates the wafer 100 after the photoresist layer 105 has been exposed to actinic radiation through an isolation mask (I) and then developed in the proper "developer" solvent. The isolation mask (I) contains opaque and transparent portions so as to expose predetermined portions of the silicon nitride layer 104 underneath the photoresist layer 105. Ultimately, the wafer will be processed in a fashion such that the isolation mask (I) will have delineated a plurality of enclosed regions on the wafer 100. Each of these regions will be electrically isolated from the other regions.

The wafer 100, is then subjected to a nitride etching process (e.g., a buffered HF/plasma etching process) to remove those portions of the nitride layer 104 which are not protected by th photoresist layer 105. The nitride etching process is selected so that the exposed silicon nitride layer 104 is removed without materially affecting the photoresist layer 105 or the silicon dioxide layer 103. This process also removes the exposed portions of the optional Silox layer, if present.

The wafer 100 is then subjected to an oxide etching process (e.g., acid etch) to remove those portions of the silicon dioxide layer 103 exposed by the previous nitride etching process. The oxide etching process is chosen so that the exposed portions of the silicon dioxide layer 103 are easily removed without materially affecting the photoresist layer 105, the silicon nitride layer 104, or the epitaxial layer 102.

Figure 3:
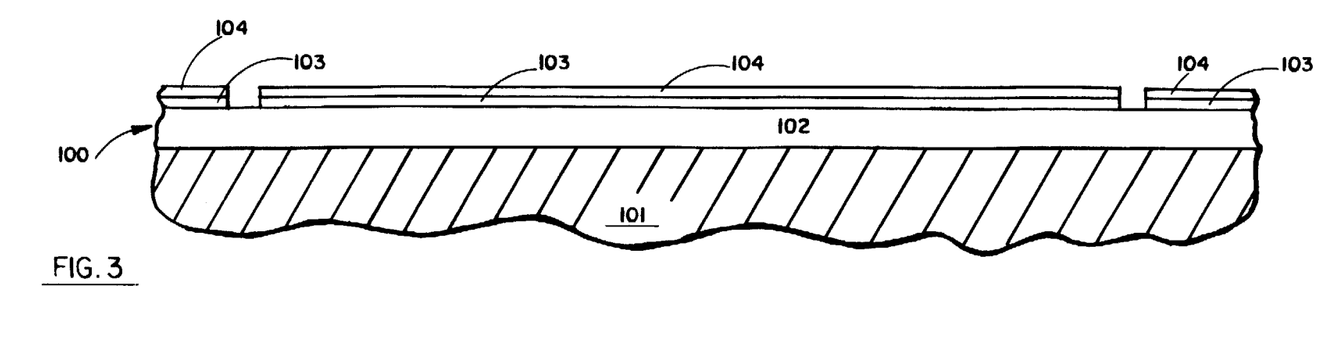

The photoresist layer 105 is then stripped from the wafer 100 using conventional stripping techniques which remove the photoresist layer 105 without materially affecting the remaining layers on the wafer 100. FIG. 3 illustrates the wafer 100 after having undergone the photoresist stripping process.

Figure 4:
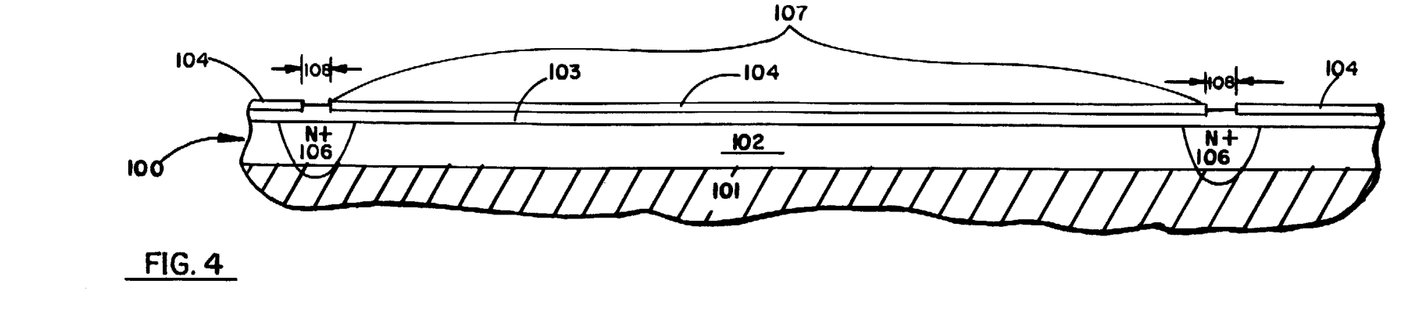
Figure 5:
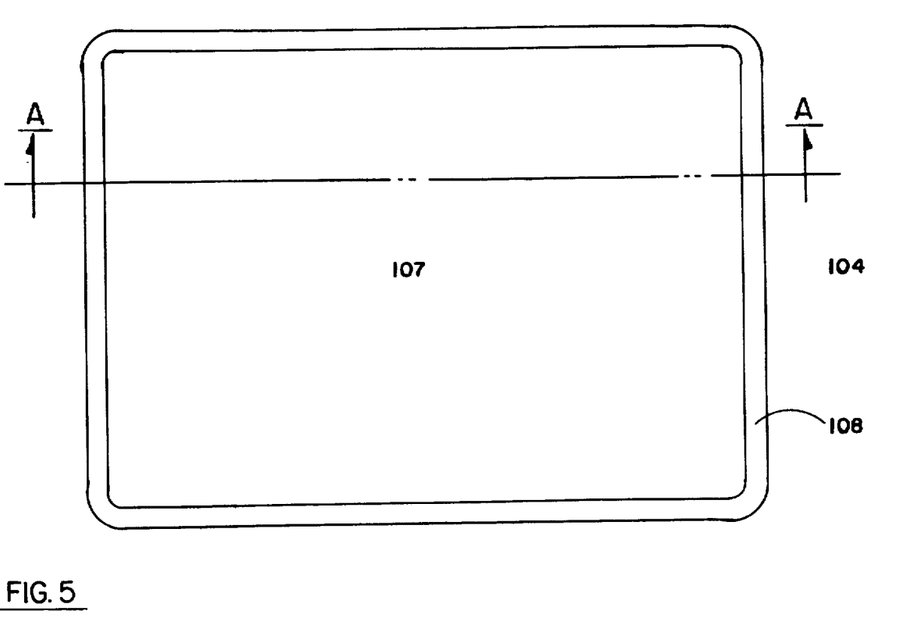
FIG. 5 is a top view of the semiconductor wafer illustrated in cross-section in FIG. 4.

A layer of phosphorus is deposited on the surface of the wafer 100 and the wafer 100 is then subjected to a phosphorus drive process. The purpose of the phosphorus deposit and drive processes are to create N+ regions 106 in the P type epitaxial layer 102 and extending into the N type substrate area 101. As illustrated in FIG. 5, which corresponds to a top view of the wafer 100 illustrated in FIG. 4, the region 107 consists of a P type epitaxial layer 102 portion entirely surrounded by an N+ type "moat" 106. Thus, the region 107 is entirely isolated from the remainder of the silicon wafer 100. Typically, the phosphorus layer that is deposited has a resistivity in the range of between 1.5 and 2.5 ohms per square and the phosphorus drive process is typically chosen so that the depthof the N+ region 106 is on the order of 14 microns so as to ensure penetration into the N type layer 101. Note, as illustrated in FIG. 4, the area 108 shows the silicon dioxide layer 103 being thicker than the remainder of the silicon dioxide layer. This is due to the oxidation growth which occurs during the phosphorus drive process. It is of little concern since during the field oxidation process (described below) the region 108 will undergo considerably more oxidation growth.

If the optional Silox layer was provided, the wafer 100 is then subjected to an acid etch process to remove the remaining portions of the optional Silox layer previously protected by the photoresist layer 105.

The wafer 100 may then be subjected to a steam process to form a thin layer of silicon oxynitride on the surface of the exposed silicon nitride layer 104. The purpose of the oxynitride layer is to maintain stability of the protected gate oxide areas of the memory devices to be formed. As with the optional Silox layer, this oxynitride layer has been omitted from the drawing figures to improve clarity.

Figures 6, 7:
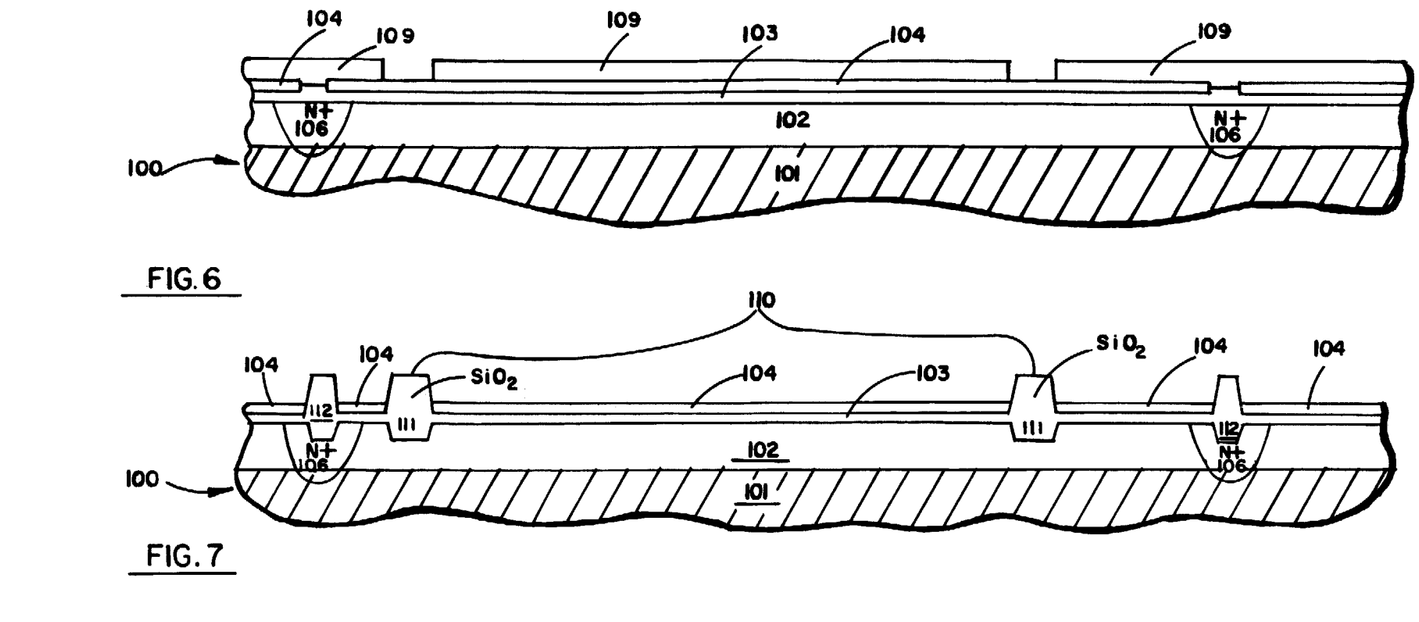

A layer of photoresist 109 is then applied to the surface of the wafer 100 and then exposed to actinic radiation through a N mask. The purpose of the N mask is to delineate regions 110 within the region 107. These additional regions 110 are electrically isolated from each other. The exposed photoresist layer 109 is then subjected to a "developer" solvent bath in the same fashion described above with respect to the photoresist layer 105. FIG. 6 illustrates the wafer 100 after the photoresist layer 109 has undergone the development step.

The exposed regions of the silicon nitride layer 104 are then removed using a nitride etching process (e.g., plasma etching process) to selectively remove the exposed portions of the silicon nitride layer 104 without materially affecting the other materials comprising the wafer 100.

The wafer 100 is then subjected to an oxide etching process to selectively remove those portions of the silicon dioxide layer 103 exposed by the previous nitride etching layer. The oxide etching process is again chosen so as to easily remove the exposed portions of the silicon dioxide layer 103 without materially affecting the remaining materials comprising the wafer 100.

The wafer is then subjected to a field implant process (to dope the exposed regions of the epitaxial layer 102 with boron ions). The field implant process is selected so that the boron ions are implanted in the exposed regions of the epitaxial layer 102, yet are shielded by the photoresist layer 109 from the remainder of the wafer 100.

Figure 8:
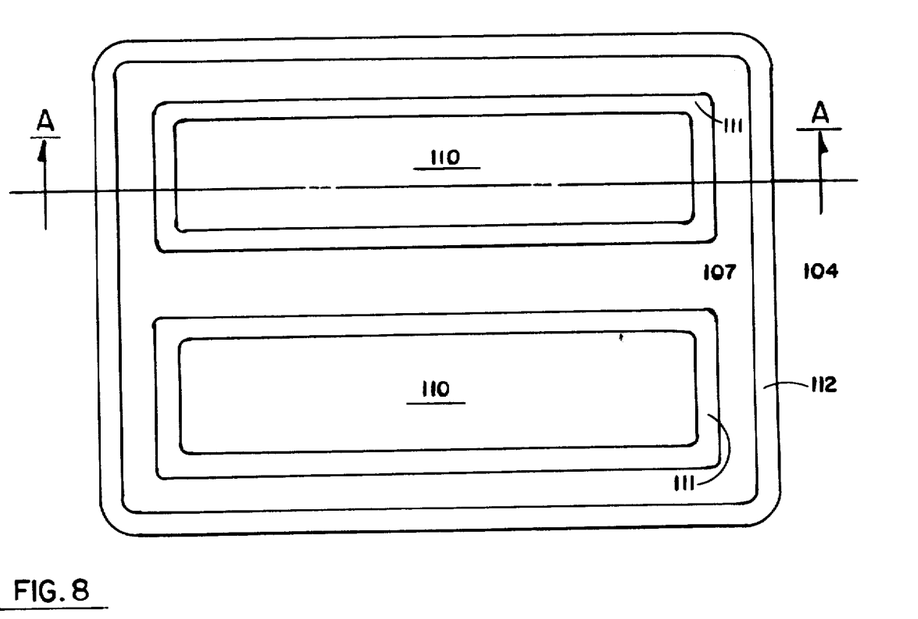

The remaining portions of the photoresist layer are then stripped using a stripping process similar to that used with respect to the photoresist layer 105. The wafer is then subjected to a thermal field oxidation step which converts the exposed portions of the epitaxial layer 102 into silicon dioxide. FIGS. 7 and 8 illustrate, respectively, cross-sectional and top views of the wafer afer having undergone the field oxidation process. FIG. 7 is not drawn to scale in that the field oxide regions 111 and 112 are typically on the order of 18,000 Å thick which, of course, is an order of magnitude thicker than the silicon dioxide layer 103 or the silicon nitride layer 104. As illustrated in FIG. 8, the region 107, bounded by the N+ region 106 as well as the silicon dioxide field oxide region 112 contains therein more than one region 110 bounded by the silicon dioxide field region 111. Although only two regions 110 are illustrated within the region 107, it is understood that many seprate regions 110 may be included within region 107.

Figure 9:
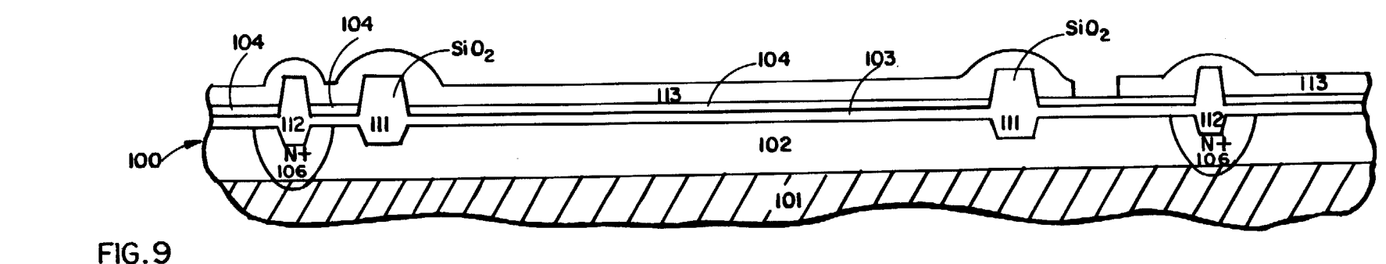

A layer of photoresist 113 is then applied to the surface of the wafer 100 and exposed to actinic radiation through a body contact mask BC. The photoresist layer 113 is then developed in a similar fashion to photoresist layers 105 and 109. The purpose of the BC body contact mask is to delineate regions which will be used to provide contact interfaces between regions of the epitaxial layer 102 and subsequently applied metal contacts. FIG. 9 illustrates the wafer 100 subsequent to the development of the photoresist layer 113.

The wafer 100 is then again subjected to a nitride etch process to selectively remove the exposed portions of the silicon nitride layer 104 without materially affecting the remainder of the wafer 100.

Figure 10:
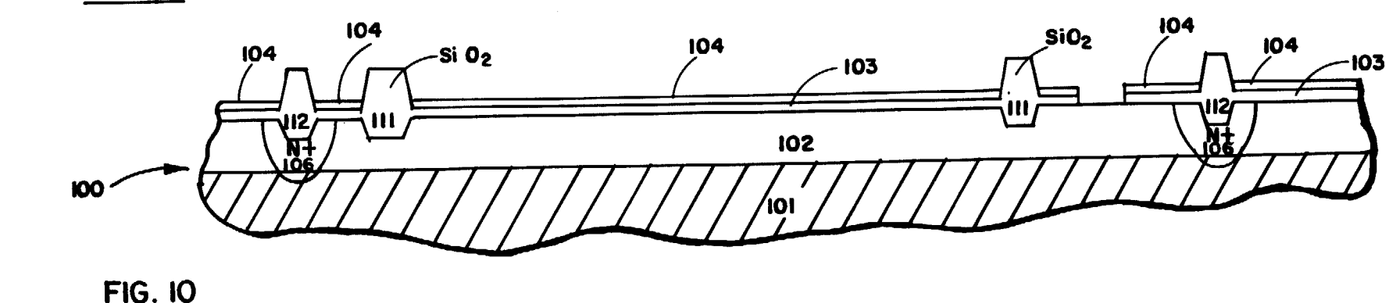

The wafer 100 is then subjected to an oxide etch process to selectively remove the portions of the silicon dioxide layer 103 exposed by the previous nitride etch process. FIG. 10 illustrates the wafer 100 after the oxide etch process.

Figure 11:
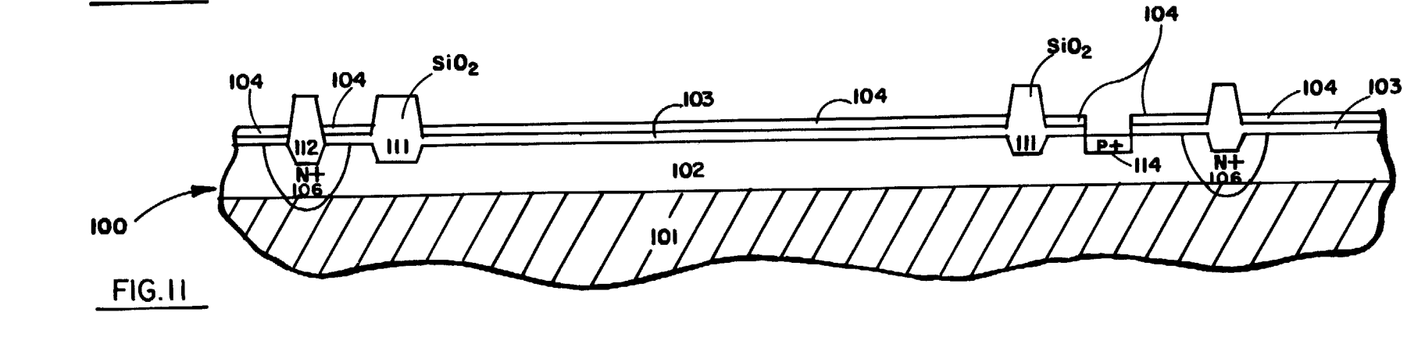

The wafer 100 is then subjected to a boron implant process to heavily implant boron ions in those portions of the epitaxial layer 102 not protected by the photoresist layer 113. The heavy boron implant process produces a P+ region 114 within the P type epitaxial region 102. The remaining portions of the photoresist layer 113 are then removed and a cross-sectional view of the wafer 100 appears as illustrated in FIG. 11.

Figure 12:
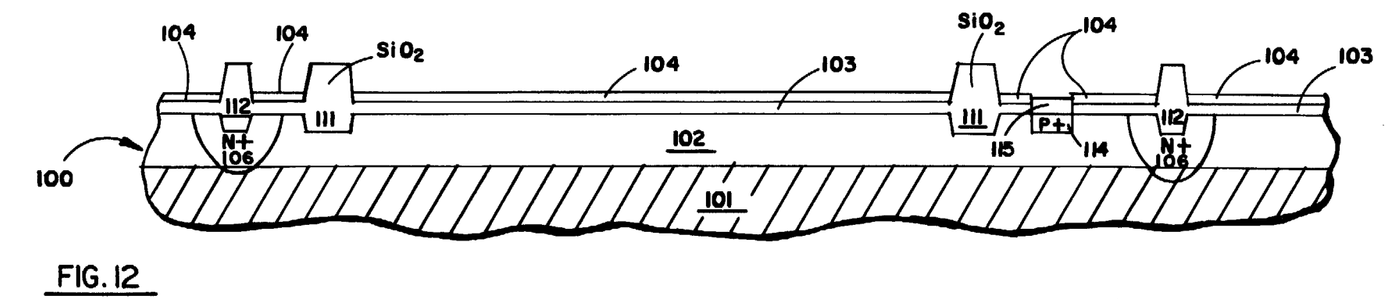

The wafer is then subjected to an oxidation process which oxidizes the exposed portions of the epitaxial layer 102 to form silicon dioxide. FIG. 12 illustrates a cross-sectional view of the wafer after having undergone the oxidation process. Note that a region of silicon dioxide 115 is produced over the P+ region 114.

Figure 13:
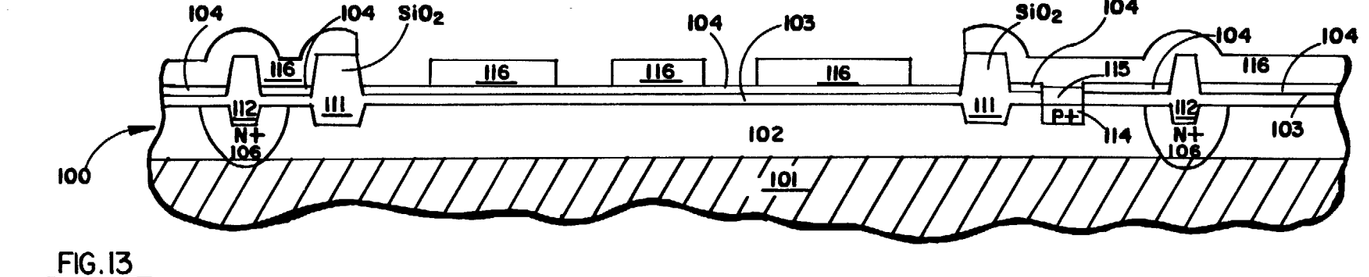

A layer of photoresist 116 is then applied to the wafer 100 and exposed to actinic radiation through the source/drain mask SD and the exposed photoresist layer 116 then subjected to the conventional development process. The purpose of the SD mask is to delineate those regions which will eventually become the source and drain regions of the field effect devices on the wafer 100. FIG. 13 illustrates a cross-sectional view of the wafer 100 after the photoresist layer 116 has undergone development.

The wafer is then subjected to a nitride etching process which selectively removes the exposed portions of the nitride layer 104 without materially affecting the remainder of the wafer 100.

The wafer 100 is then subjected to an oxide etching process to selectively remove those portions of the silicon dioxide layer 103 exposed by the previous nitride etching process.

The remaining portions of the photoresist layer 116 are then stripped using conventional stripping techniques.

Figure 14:
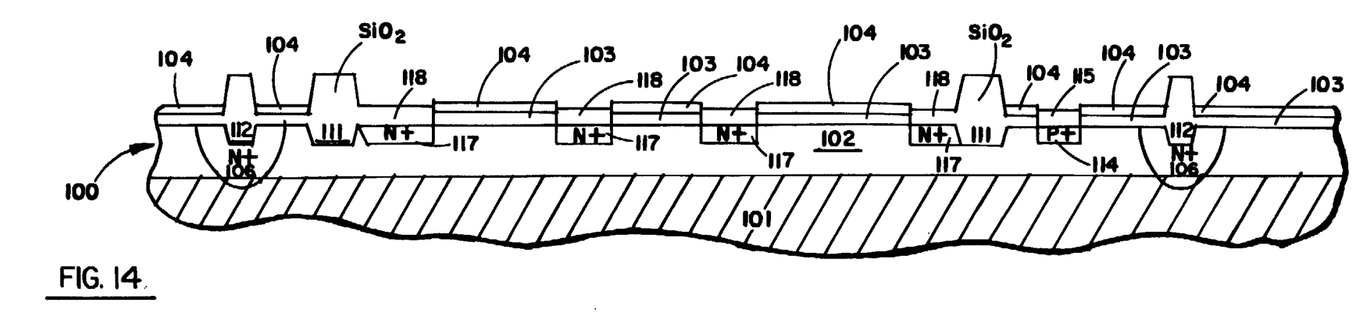

A layer of phosphorus is then deposited on the surface of the wafer 100 and the wafer subjected to a phosphorus drive process (e.g., an oxidation process) which drives the phosphorus ions into the exposed portions of the epitaxial layer 102. FIG. 14 illustrates a cross-sectional view of the wafer after having undergone the phosphorus deposition process. Note that N+ doped regions 117 have been formed within the epitaxial layer 102. Also note that silicon dioxide regions 118 have been formed by the phosphorus drive process.

The wafer is then subjected to a quick dip etch process which removes the silicon oxynitride layer incidentally formed on the silicon nitride layer 104 during the previous processing step. This thin oxynitride layer has not been illustrated in the drawing figures.

The wafer is then subjected to a nitride etch process (e.g., hot phosphoric acid) which removes all of the silicon nitride layer 104 remaining on the wafer 100.

The wafer is then subjected to an oxide etch process which removes all of the silicon dioxide layer 103 that remained under the silicon nitride layer 104. Field oxide regions 111 and 112, because of their great thickness in comparison to the silicon dioxide layer 103, are not entirely removed by the aforesaid oxide etch processes.

Figure 15:
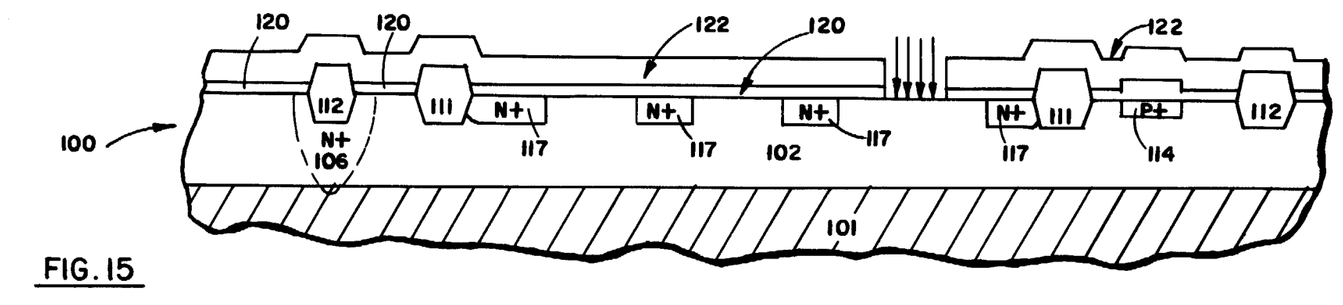

The wafer 100 is then subjected to an oxidation process (e.g., thermal oxidation) for growing a silicon dioxide layer of uniform thickness over the entire surface of the wafer 100. This silicon dioxide layer 120 typically is grown to a thickness of 700 Å.

A layer of photoresist 122 is then applied to the surface of the silicon dioxide layer 120 and exposed to actinic radiation through the memory mask MM. The photoresist layer 122 is then developed using conventional "developer" removal baths. The MM mask is used to delineate those regions of the wafer 100 containing the PDS memory transistor devices.

The wafer 100 is then subjected to an oxide etch process for selectively removing those portions of the silicon dioxide layer 120 not protected by the photoresist layer 122. FIG. 15 illustrates a cross-sectional view of the wafer 100 after having undergone the oxide etch process.

The wafer may then be subjected to an optional memory implant process for providing a particular dopant impurity concentration in the PDS portion of the epitaxial layer 102. The dopant impurity concentration after the previous oxide etch process may be acceptable, therefore rendering the memory implant process unnecessary. Note that the photoresist layer 122 shields the remainder of the wafer 100 from the dopant ions implanted by the optional memory implant process.

The remaining portion of the photoresist layer 122 is then stripped from the wafer 100 using conventional stropping techniques.

Figure 16:
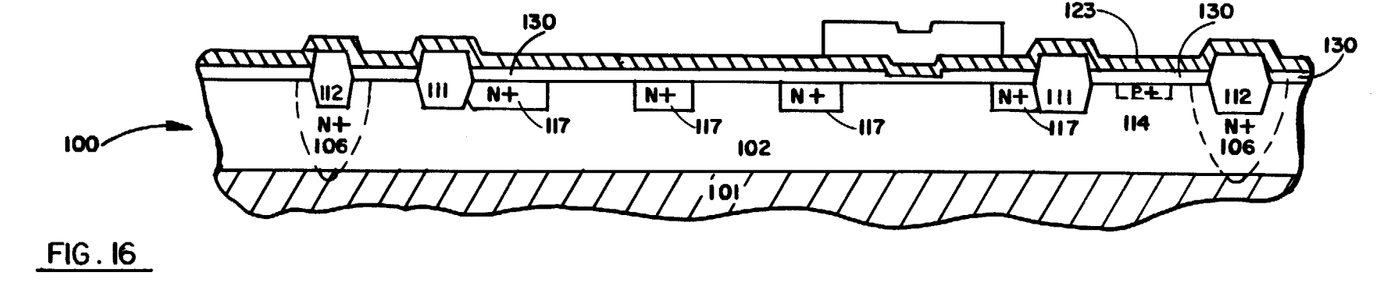

The wafer is then subjected to an oxidation process (e.g. thermal oxidation) for growing a thin silicon dioxide layer (e.g.—25 Å thick) over the surface of the epitaxial layer 102 in those regions wherein the PDS memory transistors are to be formed. This thin silicon dioxide layer will ultimately serve as the gate oxide of the memory transistor portion of each of the PDS devices.

The wafer 100 is then subjected to a nitride deposition process for depositing a layer of silicon nitride 123 on the surface of the wafer 100. Typically, this nitride layer 123 is deposited to a thickness of 350 Å. The nitride layer 123 will ultimately be utilized to form part of the gate insulator for the PDS memory devices.

A photoresist layer 124 is then applied on top of the surface of the silicon nitride layer 123 and then exposed to actinic radiation through a memory gate mask $G_2$. The photoresist layer 124 is then developed using conventional "developer" baths. FIG. 16 illustrates a cross-sectional view of the wafer 100 after having undergone the photoresist development process. The purpose of the $G_2$ memory gate mask is to protect the silicon nitride layer 123 in those regions wherein the PDS memory devices are to be located.

The silicon wafer 100 is then subjected to a nitride etch process for removing all of the silicon nitride layer 123 except for the region juxtaposed beneath the remaining portions of the photoresist layer 124.

Figure 17:
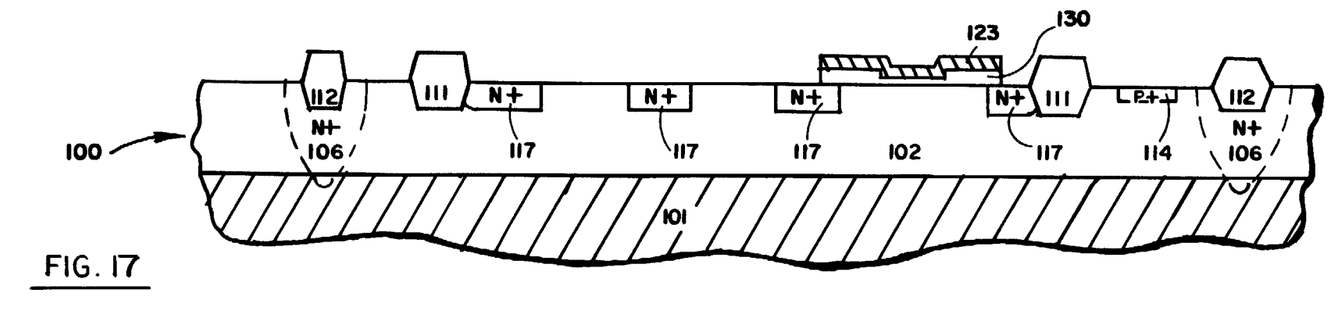

The wafer is then subjected to an oxide etch process for selectively removing those portions of the silicon dioxide layer 120 exposed by the previous nitride etch process. Note that the silicon dioxide regions 111 and 112, because of their great thickness in comparison to the silicon dioxide layer 120, are not signficantly removed by the oxide etch process.

The remaining portions of the photoresist layer 124 are then removed using conventional stripping techniques. FIG. 17 illustrates a cross-sectional view of a wafer 100 after having undergone the photoresist stripping process.

The wafer is then subjected to an oxidation process (e.g. thermal oxidation) for growing a silicon dioxide layer of uniform thickness over the entire surface of the wafer except for those regions of the wafer protected by the remaining portions of the silicon nitride layer 123 (i.e.—the location of the PDS memory devices). Typically, this oxide layer 130 is grown to a thickness on the order of 1000 Å. Portions of this oxide layer 130 will subsequently be used to form the gate oxide regions of the peripheral fixed threshold transistors located on the silicon wafer 100.

The wafer 100 may then be subjected to an optional $V_{TE}$ ion implant for implanting dopant ions into the wafer 100 for controlling the threshold of the enhancement devices to be fabricated on the surface thereof.

A photoresist layer 131 is then applied to the surface of the wafer 100 and exposed to actinic radiation through a depletion mask D. The photoresist layer 131 is then developed using conventional "developer" baths. The depletion mask D is arranged such that the remaining portions of the photoresist layer 131 protect the surface of the silicon wafer 100 except for those regions which will ultimately become the channel areas of the depletion devices on the surface of the wafer 100.

The wafer 100 is then subjected to an implant process for implanting phosphorus or other dopant ions into those unprotected regions of the wafer 100 which are to become the channel areas of the depletion devices throughout therein.

The remaining portions of the photoresist layer 131 are then stripped from the wafer 100 using conventional stripping techniques.

Figure 18:
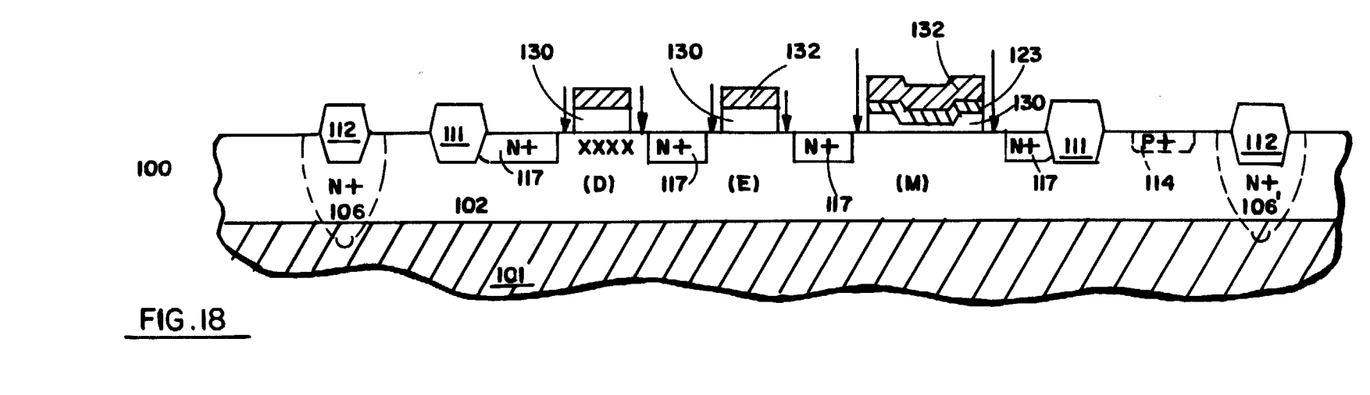

The wafer is then subjected to a polysilicon deposition process for applying a thick (e.g. 5000 Å) layer of N+ doped polysilicon. This polysilicon will eventually be delineated to define the polysilicon gate electrodes for all of the transistors located on the wafer 100. In addition, remote gate contacts might also be delineated using the same polysilicon layer 132.

A layer of photoresist 133 is then applied to the surface of the polysilicon layer 132 and exposed to actinic radiation through a gate mask $G_1$. The photoresist layer 133 is then developed using conventional "developer" baths. As indicated above, the gate mask $G_1$ is arranged so that the remaining portions of the photoresist layer 133 delineated the polysilicon gate electrodes for all of the transistors on the wafer 100. One skilled in the art would of course be aware of the fact that other conductors (e.g.—metals) could be substituted for the polysilicon.

The wafer is then subjected to an etching process (e.g. plasma etch) which selectively removes all of the polysilicon layer 132 not protected by the photoresist layer 133.

The wafer is then subjected to a nitride etch process to selectively remove any remaining portions of the nitride layer 123 exposed by the previous polysilicon etch process. In view of the fact that the only remaining silicon nitride layer 123 is located at those regions which will contain the PDS memory devides, this nitride etch process removes only so much of the nitride layer 123 which is not directly aligned with the polysilicon retained over the memory device regions. Thus, if the $G_1$ and $G_2$ gate masks were precisely aligned with each other, the nitride etch process would be unnecessary. The $G_1$ masking process steps thus, in effect, constitute a self-aligned device fabrication process. This step may not be necessary if the correct implant energy for the subsequent implant process is chosen so that the implant ions may penetrate through the silicon nitride layer 123.

The remaining photoresist layer 133 is removed from the surface of the wafer 100 by conventional stripping techniques.

The wafer 100 is then subjected to a phosphorus implant process for implanting phosphorus ions for completion of the source and drain regions of the peripheral transistors and thus to complete the definition of the channel regions of such peripheral transistors. FIG. 18 illustrates a cross-sectional view of the wafer 100 undergoing the phosphorus implant step.

Figure 19:
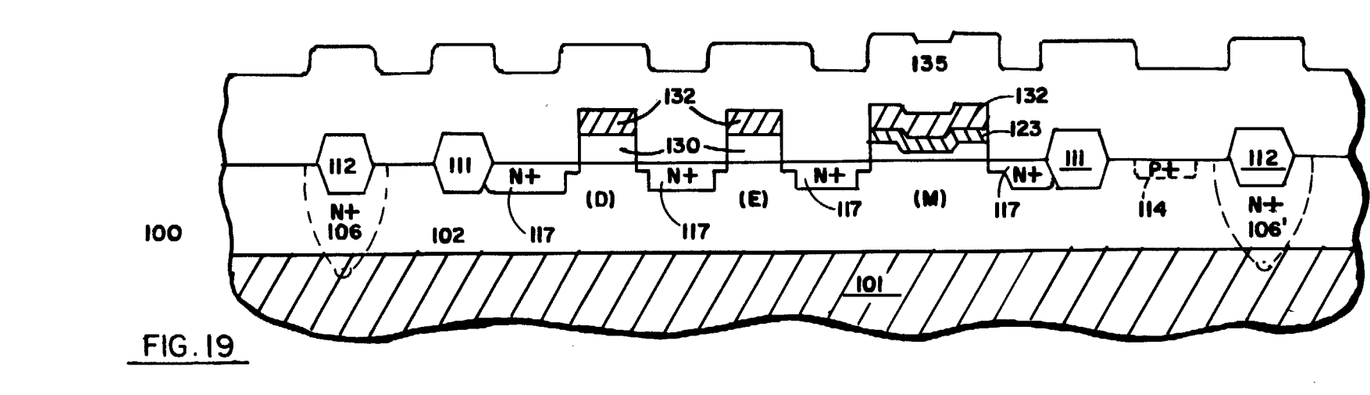

A layer of phosphorus doped Silox 135 is then applied to the surface of the wafer 100. Typically, the Silox layer 135, containing 7-8% phosphorus doping, is deposited to a thickness on the order of 10,000 Å. The purpose of the doped Silox layer 135 is to passivate the active devices of the wafer 100. Doped Silox is used rather than undoped Silox because of the fact that the "flow characteristics" of doped Silox are better than the "flow characteristics" of undoped Silox. FIG. 19 illustrates the wafer 100 after having undergone the Silox deposition step.

A layer of photoresist 140 is then applied to the surface of the Silox 135 and exposed to actinic radiation through a contact mask C. The photoresist layer 140 is then subjected to conventional "developer" baths. The purpose of the contact mask C is to deliniate "windows" through the Silox layer 135 so as to afford contact between devices on the wafer 100 and the subsequently applied metal layer.

The wafer is then subjected to a Silox etch process which removes those portions of the Silox layer 135 not protected by the photoresist layer 140.

The remaining portions of the photoresist layer 140 are then removed by conventional stripping techniques and the remaining Silox layer 135 may be optionally subjected to a "reflow" process for smoothing the surface of the Silox layer 135 to achieve better step coverage.

Figure 20:
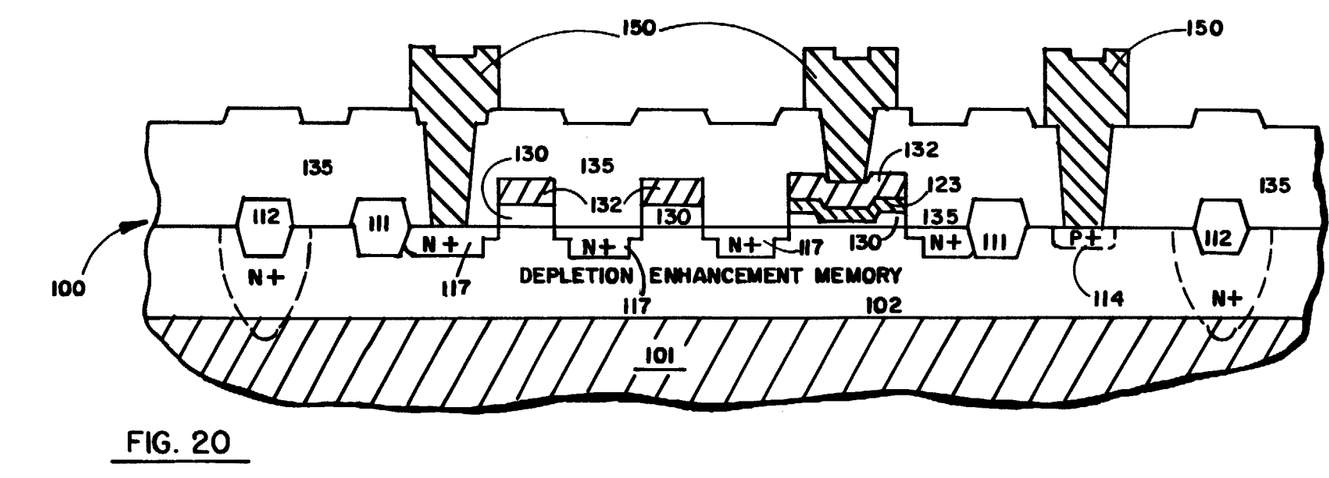

The wafer 100 is then subjected to a dip etch process for removing any thin layers of oxide that may be covering the contact regions previously delinated by the contact mask C.

The wafer 100 is then subjected to a metal deposition process for depositing a layer of metal (typically an aluminum/silicon alloy) which will be delineated to provide the connections to the elements contained within the wafer 100.

A photoresist layer 155 is then applied atop the surface of the metal layer 150 and exposed to actinic radiation through a metal mask M. The photoresist layer 155 is then developed using conventional "developer" baths. As indicated above, the metal mask M delinates the metal contacts on the wafer 100.

The wafer is then subjected to a metal etch process for selectively removing those portions of the metal layer 150 not protected by the photoresist layer 155.

The remaining portions of the photoresist layer 155 are then removed using conventional stripping techniques.

The wafer 100 may then be subjected to a polysilicon etch process if an aluminum/silicon alloy was used for the metal layer 150. The previous metal etch process removes the aluminum but leaves a residue of silicon on the field, which is removed by the polysilicon etch process.

The wafer 100 may then be subjected to a sintering process which conditions the metal layer 150 so as to improve the metal/silicon interface.

The wafer is then subjected to an oxide stripping step to remove the oxide which has formed on the lack of the wafer 100. This allows for subsequent mechanical and electrical contact to the substrate.

The wafer is then subjected to conventional finishing processes which may include sand-blasting, cleaning, additional passivation, etc.

These and other modifications and adaptations of the process and resulting structures and integrated circuits in accordance with this invention as disclosed herein will be apparent to those of skill in the art, and thus it is intended by the appended claims to cover all such modifications and adaptations which fall within the true spirit and scope of the invention.

I claim:

1. A method of fabricating a very large scale integrated circuit chip comprising at least one silicon gate protected drain-source nonvolatile memory element having a channel of a first conductivity and a two layer silicon dioxide/silicon nitride gate insulator; said chip further comprising at least one insulated gate transistor having single layer silicon dioxide gate insulator; said method comprising the steps of:
   (a) providing a silicon wafer including an epitaxial layer of silicon having a second conductivity opposite from said first conductivity;
   (b) selectively doping a plurality of regions of the epitaxial layer with dopant ions to change the conductivity of the plurality of regions to the second conductivity, the plurality of regions including at least one first region and one second region respectively corresponding to the source and drain regions of each of at least one protected drain-source non-volatile memory element and at least one third region and one fourth region respectively corresponding to the source and drain regions of each of at least one insulated gate transistor;
   (c) selectively applying a first thick layer of silicon dioxide on the surface of the epitaxial layer in a region corresponding to the fixed threshold gate region of each of at least one protected drain-source nonvolatile memory elements;
   (d) selectively applying a second thin layer of silicon dioxide on the surface of the epitaxial layer in a region corresponding to the variable threshold gate region of each of at least one protected drain-source nonvolatile memory elements;
   (e) selectively applying a layer of silicon nitride on the surface of the first and second silicon dioxide layers;
   (f) selectively applying a third thick layer of silicon dioxide on the surface of the epitaxial layer in a region corresponding to the gate region of each of at least one insulated gate transistor;
   (g) selectively applying a layer of one of either polycrystalline silicon or metal on at least the surface of the third silicon dioxide layer and the silicon nitride layer;
   (h) selectively applying an insulated passivation layer on the surface of the very large scale integrated circuit chip, the passivation layer including windows therein, whereby regions of the chip to be electrically connected to are left exposed;
   (i) selectively applying a conductive layer to the surface of the passivation layer and the exposed regions of the chip, wherein electrical connections to the chip are formed.

2. A method as in claim 1, further comprising the following step to be performed subsequent to step (a):
   forming at least one field oxide region on said epitaxial layer, whereby said field oxide region electrically isolates a closed region portion of said epitaxial layer from the remaining portion of said epitaxial layer.

3. A method as in claim 1, further comprising the step of selectively doping at least one body contact region of the epitaxial layer with dopant ions for increasing the conductivity of said body contact region and facilitating electrical connection therewith by said conductive layer applied in step (i).

4. A method as in claim 1, further comprising the step of selectively implanting dopant ions in a region corresponding to the gate region of each of said at least one silicon gate protected drain-source nonvolatile memory element.

5. A method as in claim 1, wherein said layer of one of either polycrystalline silicon or metal is delineated to form a remote gate contact to at least one of either said at least one silicon gate protected drain-source nonvolatile memory elements and said at least one insulated gate transistor.

6. A very large scale integrated circuit chip fabricated in accordance with the method of claims 1, or 2, or 3, or 4, or 5.

7. A method as in claim 1 or 2 or 3 or 4 or 5, wherein the second thin layer of silicon dioxide selectively applied in step (d) is applied to a thickness on the order of 25 Å.

8. A method as in claim 1 or 2 or 3 or 4 or 5, wherein the layer of silicon nitride selectively applied by step (e) is applied to a thickness on the order of 350 Å.

9. A method as in claim 7 wherein the first thick layer of silicon dioxide selectively applied in step (c) is applied to a thickness on the order of 1,000 Å.

10. A method as in claim 8 wherein the first thick layer of silicon dioxide selectively applied in step (c) is applied to a thickness on the order of 1,000 Å.

* * * * *